United States Patent
Olsson

(10) Patent No.: US 12,068,726 B2
(45) Date of Patent: *Aug. 20, 2024

(54) MONOLITHIC MICROWAVE INTEGRATED CIRCUIT FRONT-END MODULE

(71) Applicant: EPINOVATECH AB, Lund (SE)

(72) Inventor: Martin Andreas Olsson, Lund (SE)

(73) Assignee: EPINOVATECH AB, Lund (SE)

( * ) Notice: Subject to any disclaimer, the term of this patent is extended or adjusted under 35 U.S.C. 154(b) by 0 days.

This patent is subject to a terminal disclaimer.

(21) Appl. No.: 18/297,526

(22) Filed: Apr. 7, 2023

(65) Prior Publication Data
US 2023/0261621 A1  Aug. 17, 2023

Related U.S. Application Data

(63) Continuation of application No. 17/807,677, filed on Jun. 17, 2022, now Pat. No. 11,652,454, which is a (Continued)

(30) Foreign Application Priority Data

Feb. 14, 2020 (EP) ..................... 20157460

(51) Int. Cl.
*H03F 3/187* (2006.01)
*H03F 3/195* (2006.01)
*H03F 3/24* (2006.01)

(52) U.S. Cl.
CPC ............. *H03F 3/245* (2013.01); *H03F 3/195* (2013.01); *H03F 2200/451* (2013.01)

(58) Field of Classification Search
CPC .................................. H03F 3/187; H03F 1/07
(Continued)

(56) References Cited

U.S. PATENT DOCUMENTS

| 2,463,073 A | 3/1949 | Webb |
| 4,103,325 A | 7/1978 | Hyman et al. |
| (Continued) | | |

FOREIGN PATENT DOCUMENTS

| CN | 101621292 | 5/2012 |
| CN | 103477418 | 12/2013 |
| (Continued) | | |

OTHER PUBLICATIONS

International Search Report and Written Opinion of PCT/EP2021/053310, dated May 18, 2021 in 13 pages.
(Continued)

*Primary Examiner* — Henry Choe
(74) *Attorney, Agent, or Firm* — Knobbe, Martens, Olson & Bear, LLP

(57) ABSTRACT

There is provided a monolithic microwave integrated circuit, MMIC, front-end module which may include: a gallium nitride structure supported by a silicon substrate, a silicon-based transmit/receive switch having a transmit mode and a receive mode, a transmit amplifier configured to amplify an outgoing signal to be transmitted by said MMIC front-end module, wherein said transmit amplifier is electrically connected to said transmit/receive switch, wherein said transmit amplifier comprises a gallium nitride high-electron-mobility transistor, HEMT, formed in said gallium nitride structure. The MMIC front-end module may further include a receive amplifier configured to amplify an incoming signal received by said MMIC front-end module, wherein said receive amplifier is electrically connected to said transmit/receive switch, wherein said receive amplifier may include a gallium nitride HEMT formed in said gallium nitride structure.

17 Claims, 7 Drawing Sheets

Related U.S. Application Data continuation of application No. PCT/EP2021/053310, filed on Feb. 11, 2021.

(58) Field of Classification Search
USPC .................................. 330/307, 295, 124 R
See application file for complete search history.

(56) References Cited

U.S. PATENT DOCUMENTS

| | | | |
|---|---|---|---|
| 4,873,497 | A | 10/1989 | Kielmeyer |
| 7,250,359 | B2 | 7/2007 | Fitzgerald |
| 8,324,660 | B2 | 12/2012 | Lochtefeld et al. |
| 8,344,242 | B2 | 1/2013 | Fiorenza et al. |
| 9,275,857 | B1 | 3/2016 | Hersee |
| 9,379,204 | B2 | 6/2016 | Fogel et al. |
| 9,764,950 | B2 | 9/2017 | Colinge et al. |
| 9,887,637 | B1 | 2/2018 | Shah et al. |
| 9,984,872 | B2 | 5/2018 | Park et al. |
| 10,439,671 | B2* | 10/2019 | Kamgaing .............. H04B 1/44 |
| 10,742,208 | B1 | 8/2020 | Moyer et al. |
| 11,316,165 | B2 | 4/2022 | Olsson |
| 11,469,300 | B2 | 10/2022 | Olsson |
| 11,634,824 | B2 | 4/2023 | Olsson |
| 11,652,454 | B2 | 5/2023 | Olsson |
| 11,695,066 | B2 | 7/2023 | Olsson |
| 2003/0022395 | A1* | 1/2003 | Olds ................ H01L 21/76895 257/E21.59 |
| 2003/0165418 | A1 | 9/2003 | Ajayan |
| 2005/0159000 | A1 | 7/2005 | Ohno et al. |
| 2005/0189566 | A1 | 9/2005 | Matsumoto et al. |
| 2006/0134883 | A1 | 6/2006 | Hantschel |
| 2006/0189018 | A1 | 8/2006 | Yi |
| 2007/0108435 | A1 | 5/2007 | Harmon |
| 2007/0215899 | A1 | 9/2007 | Thomas |
| 2007/0295993 | A1 | 12/2007 | Chen et al. |
| 2008/0122418 | A1 | 5/2008 | Biere et al. |
| 2008/0153000 | A1 | 6/2008 | Salot et al. |
| 2008/0171424 | A1 | 7/2008 | Li |
| 2009/0269909 | A1 | 10/2009 | Kim |
| 2010/0176459 | A1 | 7/2010 | Wernersson et al. |
| 2010/0259186 | A1 | 10/2010 | Ernoux |
| 2010/0027665 | A1 | 11/2010 | Wang |
| 2010/0276664 | A1 | 11/2010 | Hersee |
| 2010/0314617 | A1 | 12/2010 | Ito |
| 2011/0020704 | A1 | 1/2011 | Fukuchi |
| 2011/0036396 | A1 | 2/2011 | Jayaraman |
| 2011/0140072 | A1 | 6/2011 | Varangis |
| 2011/0143472 | A1 | 6/2011 | Seifert |
| 2011/0204381 | A1 | 8/2011 | Okada et al. |
| 2012/0001153 | A1 | 1/2012 | Hersee |
| 2012/0235117 | A1 | 9/2012 | Takashi et al. |
| 2013/0061747 | A1 | 3/2013 | Turnbull et al. |
| 2013/0175501 | A1 | 7/2013 | Hersee |
| 2013/0187627 | A1 | 7/2013 | Imada et al. |
| 2014/0008609 | A1 | 1/2014 | Chiu |
| 2014/0078781 | A1 | 3/2014 | Imada |
| 2014/0134773 | A1 | 5/2014 | Rakesh et al. |
| 2014/0197130 | A1 | 7/2014 | Lemke |
| 2014/0231870 | A1 | 8/2014 | Hoke |
| 2014/0239346 | A1 | 8/2014 | Green et al. |
| 2015/0014631 | A1 | 1/2015 | Ohlsson |
| 2015/0060996 | A1 | 3/2015 | Colinge |
| 2015/0076450 | A1 | 3/2015 | Weman |
| 2015/0084685 | A1 | 3/2015 | Hirose et al. |
| 2015/0118572 | A1 | 4/2015 | Lund et al. |
| 2015/0155275 | A1 | 6/2015 | Bahramian et al. |
| 2015/0263100 | A1 | 9/2015 | Deboy |
| 2015/0311072 | A1 | 10/2015 | Aagesen |
| 2015/0333216 | A1 | 11/2015 | Pourquire |
| 2016/0172305 | A1 | 6/2016 | Sato |
| 2016/0276433 | A1 | 9/2016 | Holland |
| 2017/0002471 | A1 | 1/2017 | Okamoto |
| 2017/0062213 | A1 | 3/2017 | Patolsky |
| 2017/0110332 | A1 | 4/2017 | Beveridge |
| 2017/0178971 | A1 | 6/2017 | Merckling et al. |
| 2017/0200820 | A1 | 7/2017 | Conway et al. |
| 2017/0229569 | A1 | 8/2017 | Chowdhury et al. |
| 2017/0257025 | A1 | 9/2017 | Meiser |
| 2017/0323788 | A1 | 11/2017 | Mi |
| 2017/0338277 | A1 | 11/2017 | Banna et al. |
| 2018/0033889 | A1 | 2/2018 | Yang et al. |
| 2018/0316383 | A1* | 11/2018 | Kamgaing .............. H01Q 21/06 |
| 2019/0081164 | A1 | 3/2019 | Shrivastava |
| 2019/0165182 | A1 | 5/2019 | Van Dal |
| 2019/0229149 | A1 | 7/2019 | Yoo |
| 2019/0284706 | A1 | 9/2019 | Takeda et al. |
| 2019/0356278 | A1 | 11/2019 | Smith |
| 2019/0393104 | A1 | 12/2019 | Ando |
| 2020/0127173 | A1 | 4/2020 | Park et al. |
| 2020/0185219 | A1 | 6/2020 | Busani et al. |
| 2020/0203556 | A1 | 6/2020 | Feuillet et al. |
| 2021/0265632 | A1 | 8/2021 | Olsson |
| 2021/0327712 | A1 | 10/2021 | Olsson |
| 2022/0231298 | A1 | 7/2022 | Olsson |
| 2022/0302293 | A1 | 9/2022 | Olsson |
| 2022/0393656 | A1 | 12/2022 | Olsson |
| 2022/0396886 | A1 | 12/2022 | Olsson |
| 2022/0399826 | A1 | 12/2022 | Olsson |
| 2022/0416025 | A1 | 12/2022 | Olsson |
| 2023/0119801 | A1 | 4/2023 | Olsson |
| 2023/0146820 | A1 | 5/2023 | Olsson |
| 2023/0327009 | A1 | 10/2023 | Olsson |
| 2023/0352575 | A1 | 11/2023 | Olsson |

FOREIGN PATENT DOCUMENTS

| | | |
|---|---|---|
| CN | 105990443 | 10/2016 |
| CN | 106549050 | 3/2017 |
| CN | 110336028 | 3/2021 |
| EP | 2571065 | 3/2013 |
| EP | 2816729 | 12/2014 |
| EP | 284700 | 1/2015 |
| GB | 2520687 | 6/2015 |
| JP | 2008057383 | 3/2008 |
| JP | 2010232423 | 10/2010 |
| JP | 2014217252 | 11/2014 |
| WO | WO 95/08452 | 3/1995 |
| WO | WO 2010/100599 | 9/2010 |
| WO | WO 2012/105901 | 8/2012 |
| WO | WO 2017/111844 | 6/2017 |
| WO | WO 2017/213644 | 12/2017 |
| WO | WO 2019/202258 | 10/2019 |
| WO | WO 2021/021415 | 2/2021 |

OTHER PUBLICATIONS

Alamo et al., III-V CMOS: the key to sub-10 nm electronics?, Microsystems Technology Laboratories, MIT, 2011 MRS Spring Meeting and Exhibition Symposium P: Interface Engineering for Post-CMOS Emerging Channel Materials.

Nainani, "High-Performance III-V PMOSFET", May 2011, in 131 pages.

Sundaram et al, "Single-crystal nanopyramidal BGaN by nanoselective area growth on AlN/Si(111) and GaN templates"., Nanotechnology, vol. 27 (2016) 7 pages.

Tripathy et al., "AlGaN/GaN two-dimensional-electron gas heterostructures on 200 mm diameter Si(111)", Applied Physics Letters, 101, 082110 (2012) https://doi.org/10.1063/1.4746751 Submitted: Feb. 7, 2012 , Accepted: Aug. 1, 2012 , Published Online: Aug. 23, 2012.

Wang et al, Germanium-Assisted Direct Growth of Graphene on Arbitrart Dielectric Substrates for Heating Device, Nano Micro Small, vol. 13, No. 28 Jul. 26, 2017.

Anonymous, "High-electron-mobility transistor—Wikipedia", Mar. 6, 2020 (Mar. 6, 2020), XP055808423, Retrieved from the Internet: URL:https://en.wikipedia.org/w/index.php?title=High-electron-mobility transistor&old id=944233239, retrieved on May 27, 2021 6 pages.

Anonymous, "Phase-shift oscillator Wikipedia" Apr. 7, 2019 (Apr. 7, 2019), XP055733459, Retrieved from the Internet: URL:https://

(56) References Cited

OTHER PUBLICATIONS en.wikipedia.org/w/index.php?title=Phase-shift- oscillator&oldid=89138949 5, retrieved on Sep. 23, 2020 in 3 pages.
Asghar Asgari, "Negative Differential Capacitance of AlGaN/GaN Heterostructure in Presence of InN Quantum Dots", SPIE, PO Box 10 Bellingham WA 98227-0010 USA, Jan. 1, 2008.
Cai et al, Monolithically Integrated Enhancement-and Depletion-Mode AlGaN/GaN HEMT for gaN Digital Integrated Circuits, vol. 53, No. 9, Sep. 1, 2006 (Sep. 1, 2006), pp. 2223-2230.
Chebrolu et al., "Recent progress in quantum dot sensitized solar cells: an inclusive review of photoanode, sensitizer, electrolyte, and the counter electrode", Journal of Materials Chemistry C 2019, pp. 4911-4933.
Dahal et al., "Realizing InGaN monolithic solar-photoelctrochemical cells for artificial photosynthesis", Appl. Phys, Lett. 104, 143901, (2014); Published Onlines: Apr. 9, 2014.
Enthaler et al, "Carbon dioxide and formic acid-the couple for environmental-friendly hydrogen storage?", Energy & Enviormental Science, 2010 pp. 1207-1217.
Faunce et al., "Nanotechnology, Plasma, Hydrogen from Artificial Photosynthesis, and Fuel Cells: Powering the Developing World to the Sustainocene", Nanotechnology Toward the Sustoinocene, Chapter 11, pp. 241-257.
Fujii et al., "Photoelectrochemical Properties of Ingan For H2 Generation From Aqueous Water", Japanese Journal of Applied Physics, Japan Society Of Applied Physics, JP, vol. 44, No. 10, Oct. 11, 2005 (Oct. 11, 2005), pp. 7473-7435.
Gust et al., "Solar Fukes via Artificial Photosynthesis", Department of Chemistry and Biochemestry and Center for Bioenergy and Photosynthesis, Arizona State University, Jul. 17, 2009, in 9 pages.
Iqbal et al. "Reactive Sputtering of Aluminum Nitride Thin Files for Piezoeletric Applications: A Review", Sensors, vol. 18, No. 6, Jun. 2018 in 21 pages.
Kampl et al., "2500 W full-bridge totem-pole power factor correction using CoolGaN," Nov. 5, 2018, pp. 1-46.
Kozodoy et al. "Polarization-enhanced Mg doping of AlGaN/GaN superlattices," Applied Physics Letters, vol. 75, No. 16, Oct. 18, 1999, pp. 2444-2446.
Krishna et al. "AlGaN/GaN Superlattice-Based p-Type Field-Effect Transistor with Tetramethylammoninum Hydoxide Treatment," Physica Status Solidi, vol. 217, No. 7, Apr. 1, 2020 in 8 pages.
Kumar et al. "Quantum dot activated indium gallium nitride on silicon as photoanode for solar hydrogen generation", Communcations Chemestry, in 7 pages.
Lin et al., "Physical and electrical characteristics of AlGaN/GaN metal-oxide-semiconductor high-electron-mobility transistors with rare earth Er2O3 as a gate dielectric", Thin Solid Films, vol. 544, Oct. 2013 (Oct. 13, 2013), pp. 526-529.
Lu et al., "Paralleling GaN E-HEMTs in 10KW-100kW systems," 2017 IEEE Applied Power Electronics Conference and Exposition, Mar. 26, 2017, pp. 3049-3056.
Matioli et al. "Room-Temperature Ballistic Transport in III-Nitride Heterostructures," ResearchGate, https://www.researchgate.net/publication/271329249_Room-Temperature_Ballistic_Transport_in_III-Nitride_Heterostructures/link/57d9301d08ae6399a39acce3/download?_tp=eyJjb250ZXh0Ijp7ImZpcnN0UGFnZSI6InB1Ymxp Y2F0aW9uliwicGFnZSI6InB1YmxpY2F0aW9uIn19, Jan. 2015, in 10 pages.
Mitsunari et al., "Single-crystalline semipolar GaN on Si(001) using a directional supttered AlN intermediate layer", Journal of Crystal Growth, 2015 in 4 pages.
Mukhopadhyay, P. "Comparative DC Characteristic Analysis of AlGaN/GaN HEMTs Grown on Si(111) and Sapphire Substrates by MBE" Jour. Of Elec. Mat. vol. 43, No. 4, Feb. 14, 2014 pp. 1263-1270 (Year: 2014).
Naveed ul Hassan Alvi et al., "InN/InGaN Quantum Dot Photoelectrode: Efficient Hydrogen Generation By Water Splitting At Zero Voltage", Nano Energy, vol. 13, Mar. 6, 2015 (Mar. 6, 2015), pp. 291-297.
Park, J. "Comparison of AlGaN/GaN High Electron Mobility Transistor with AlN or GaN as a cap layer" Conference paper proceedings on Research Gate available online at address recited in the Office Action as of Jul. 14, 2015 pp. 1-2 (Year: 2015).
Raj et al. "Demonstration of a GaN/AlGaN Superlattice-Based p-Channel FinFET With High ON-current," IEEE Electron Device Letters, vol. 41, No. 2, Dec. 31, 2019, pp. 220-223.
Ramakrishna et al. "Nitrogen doped CNTs supported Palladium electrocatalyst for hydrogen evolution reaction in PEM water electrolyser", International Journal of Hydrogen Energy, 2016 pp. 20447-20454.
Shibata, D. "1. 7 kV/ 1.0 mQcm2 Normally-off Vertical GaN Transistor on GaN substrate with Regrown p-GaN/AlGaN/GaN SemipolarGate Structure" IEEE Int. Elec. Dev. Meet. IEDM 2016, Feb. 2, 2017 pp. 248-251 (Year: 2016).
Shrestha et al. "Optimal design 5,9 of the multiple-apertures-GaN-based vertical HEMTs with SiO2 current blocking layer", Journal of Computational Electronics, Springer US, Boston, vol. 15, No. 1. Aug. 7, 2015 (Aug. 7, 2015 pp. 154-162.
Sritoma et al., IIA Novel GaN-Hemt based Inverter and Cascade Amplifier 11 , 2018 IEEE Electron Devices Kolkata Conference (EDKCON), IEEE, Nov. 24, 2018 (Nov. 24, 2018), pp. 465-469.
Tavares et al., "Implementation of a high frequency PWM signal in FPGA FOR GaN power devices switching", 2017 Brazilian Power Electronics Conference (COBEP), IEEE, Nov. 19, 2017 (Nov. 19, 2017), pp. 1-7.
Zhang et al., "Conducted noise reduction of totem-pole bridgeless PFC converter using GaN HEMTs," 2015 IEEE International Telecommunications Energy Conference, Oct. 18, 2015, pp. 1-5.

* cited by examiner

MONOLITHIC MICROWAVE INTEGRATED CIRCUIT FRONT-END MODULE

TECHNICAL FIELD

The present invention relates to the field of radio frequency, RF, transceiver front-end modules. In particular the invention relates to monolithic microwave integrated circuit, MMIC, front-end modules.

BACKGROUND

For many applications such as RF amplifiers, traditional silicon complementary metal-oxide-semiconductor, CMOS, transistors, are reaching the end of the road in terms of performance. Gallium nitride-based transistors and high-electron-mobility transistors, HEMTs, provide improved performance compared to traditional silicon counterparts. However, silicon is still desirable for many applications, such as digital logic and switching, due to the overall technical maturity of the silicon CMOS technology. Therefore, it may be desirable to have integrated RF circuits, comprising both silicon and gallium nitride devices, e.g. transistors, switches, converters, and amplifiers. However, such integration is not trivial in part due to material property differences. These differences make it particularly complicated to integrate high-quality gallium nitride material onto conventional silicon substrates. This is problematic as a high-quality gallium nitride material is required to create devices, e.g. HEMTs with high performance. Conventional solutions to this problem may include thick and complex buffer layers or structures. However, these are not consistently enough to do more than mitigate the quality losses from integration. Due to the added thickness of buffer layers or structures, material use is also unfavorably increased. There is thus need for improvements within the technical field.

SUMMARY OF THE INVENTION

An object of the present invention is to at least mitigate some of the issues in the prior art.

According to a first aspect of the present invention there is provided a monolithic microwave integrated circuit, MMIC, front-end module. The MMIC comprising:
- a gallium nitride structure supported by a silicon substrate;
- a silicon-based transmit/receive switch having a transmit mode and a receive mode;
- a transmit amplifier configured to amplify an outgoing signal to be transmitted by the MMIC front-end module, wherein the transmit amplifier is electrically connected to the transmit/receive switch, wherein the transmit amplifier comprises a gallium nitride high-electron-mobility transistor, HEMT, formed in the gallium nitride structure; and
- a receive amplifier configured to amplify an incoming signal received by the MMIC front-end module, wherein the receive amplifier is electrically connected to the transmit/receive switch, wherein the receive amplifier comprises a gallium nitride HEMT formed in the gallium nitride structure.

The term "gallium nitride structure" should be understood to refer to a laterally confined structure, i.e. not a layer covering the entire silicon substrate area. The gallium nitride structure should further be understood as a structure that comprises gallium nitride material to any extent.

The term "supported by" refers to the gallium nitride structure being situated on or above the silicon substrate in a vertical direction perpendicular and normal to a top surface of the silicon substrate.

The terms "transmit mode" and "receive mode" refers to having the transmit/receive switch adapted for either transmitting or receiving wireless signals. In practice, the transmit mode may see the switch being adapted to provide a more direct electrical path between the transmit amplifier and an antenna for outgoing signals while the receive mode may see the switch being adapted to provide a more direct electrical path between the antenna and the receive amplifier for incoming signals. The transmit mode may be understood as a mode in which the MMIC front-end module may transmit outgoing wireless signals. The receive mode may be understood as a mode in which the MMIC front-end module may receive incoming wireless signals. The MMIC front-end module may be understood as a transceiver due to the presence of both a transmit mode and a receive mode.

The term "transmit amplifier" may be generally understood as a RF power amplifier (PA). Consequently, the term "receive amplifier" may be generally understood as a RF low-noise amplifier (LNA).

Materials, i.e. elements and compounds, may be referred to either by their full name e.g. silicon or gallium nitride or by their IUPAC symbols/designations e.g. Si or GaN.

The terms "outgoing signal" and "incoming signal" may be understood as electrical signals, e.g. a voltage or a current, on an electrical node or electromagnetic signals, e.g. radio waves, in a free space medium, e.g. air or vacuum. The signals may be converted between being purely electrical and being electromagnetic by an antenna part of, or connected to, the MMIC front-end module. The signals may be processed through the components of the MMIC front-end module e.g. amplifiers and frequency converters.

The outgoing signal may still be the outgoing signal after having it be frequency up-converted by a frequency converter, amplified by the transmit amplifier, and/or transmitted into free space by an antenna. Correspondingly, the incoming signal may still be the incoming signal after having it be received by an antenna, amplified by the receive amplifier, and/or frequency down-converted by a frequency converter.

By providing the gallium nitride structure on or above the silicon substrate the inventor has realized that the gallium nitride HEMT devices, as part of the transmit and receive amplifiers, may be more closely integrated with the silicon-based transmit/receive switch as well as other silicon-based devices and components. This is in turn advantageous as it provides the ability to use only gallium nitride where it is deemed most necessary, e.g. for the amplifiers, while allowing less critical components/devices of the MMIC, or just components/devices with different requirements, to be silicon-based instead.

Gallium nitride material may feature larger band gaps, higher electron mobility, increased thermal conductivity, and higher melting points compared to conventional silicon material. In turn, this may lead to devices, e.g. transistors, with higher switching frequency, less energy loss, higher voltage operation, and higher temperature operation.

HEMTs may be advantageous compared to conventional metal-oxide-semiconductor field-effect transistors (MOSFETs). HEMTs may provide ballistic charge carrier transport with less electrical resistance. This leads to increased efficiency, speed, and power performance in HEMTs.

As a consequence of featuring HEMTs and gallium nitride material, the MMIC front-end module may provide power savings and overall more efficient operation compared to conventional solutions and devices within the technical field.

The transmit amplifier may comprise a plurality of HEMTs formed in the gallium nitride structure.

The receive amplifier may comprise a plurality of HEMTs formed in the gallium nitride structure.

The transmit amplifier, and indeed also the receive amplifier, may be created with only one HEMT or a plurality of HEMTs each depending on chosen designs for the amplifier circuits. Less complex amplifiers may feature a no more than a few HEMTs, or even only one HEMT, while more advanced multi-HEMT amplifiers may provide better amplifier performance metrics such as higher frequency operation or lower power losses.

The gallium nitride structure supported by the silicon substrate may comprise a first gallium nitride island and a second gallium nitride island, wherein the first gallium nitride island and the second gallium nitride island are physically separated and laterally co-arranged on the silicon substrate.

One advantage of providing the gallium nitride structure as a plurality of islands may be the improvements to the thermal characteristics. Instead of expanding and contracting due to changes in temperature as one structure islands may do so individually an independently. As such, the mechanical stresses of expansion and contraction may be distributed over the islands. The overall largest mechanical stresses may thus be reduced. This may be especially relevant as silicon and gallium nitride have different thermal expansion coefficients. Furthermore, controlling the temperature of gallium nitride islands, e.g. by active or passive cooling, may be less complex than for larger structures. Gallium nitride islands may also be advantageous as heat accumulation from a plurality of devices may be more equally distributed.

The gallium nitride HEMT of the transmit amplifier may be formed in the first gallium nitride island. The gallium nitride HEMT of the receive amplifier may be formed in the second gallium nitride island.

By locating different devices onto different physical structures, i.e. islands, interference of a first device on the operation of a second device may be reduced. Such interreference may be understood as e.g. a noisier signal.

The first gallium nitride island may have a lateral dimension in the range from 0.1 μm to 10 μm. The second gallium nitride island may have a lateral dimension in the range from 0.1 μm to 10 μm.

The gallium nitride structure may have a lateral dimension in the range from 0.1 μm to 10 μm.

The term "lateral dimension" may refer to a dimension parallel with a planar top surface of the silicon substrate. In terms of the gallium nitride structure or the gallium nitride islands, a lateral dimension may be understood as e.g. a diameter or radius of a polygon or circle. Due to gallium nitride most often being organized in a wurtzite crystal structure the shape of the gallium nitride structure or the gallium nitride islands may correspond to a hexagon. A lateral dimension may alternatively refer to other dimensions such as e.g. a length of an edge of the structure or islands.

The MMIC front-end module may further comprise:
a silicon-based frequency up-converter, electrically connected to the transmit amplifier, wherein the frequency up-converter is configured to up-convert a frequency of the outgoing signal to be transmitted by the MMIC front-end module; and a silicon-based frequency down-converter, electrically connected to the receive amplifier, wherein the frequency down-converter is configured to down-convert a frequency of the incoming signal received by the MMIC front-end module.

The term "frequency down-converter", and indeed also the "frequency up-converter" may be understood as corresponding to RF mixers. A frequency up-converter may be understood as converting an outgoing, to be transmitted, intermediate frequency (IF) signal to a RF signal. A frequency up-converter may consequently be understood as converting an incoming/received RF signal to an IF signal.

The proposed gallium nitride and silicon device integration may, in addition to enabling the transmit/receive switch being silicon-based, also enable the frequency converters to be silicon based-devices.

The MMIC front-end module may further comprise an antenna configured to transmit and receive wireless signals wherein the transmit/receive switch is electrically connected to the antenna.

The antenna may be understood as any component/structure configured or suitable for transmitting and receiving wireless, electromagnetic, signals. Integrating the antenna in the MMIC front-end, close to the semiconductor devices, amplifiers, and switches, is preferable as parasitic losses may be reduced and as overall MMIC front-end module size may be miniaturized.

The antenna may be supported by the silicon substrate. As such, even closer antenna integration may be achieved.

The antenna may be an array antenna, the array antenna comprising a plurality of antenna array elements. Antenna arrays enable beam shaping and thus also less wasteful and more flexible wireless communication.

The gallium nitride structure may comprise a vertical nanowire structure arranged perpendicularly to the silicon substrate.

The gallium nitride structure may comprise a gallium nitride layer and an $Al_xGa_{1-x}N$ layer, wherein $0 \leq x \leq 0.95$.

The gallium nitride structure may comprise an aluminium nitride layer.

An advantage of such a gallium nitride structure include improved semiconductor material with high crystal quality and less defects. The gallium nitride structure may also be made thinner and require less material to produce than structures using buffer layers.

The silicon-based transmit/receive switch may be integrally formed into the silicon substrate or wherein the silicon-based transmit/receive switch is supported by the silicon substrate.

As such, closer integration of components may be achieved. By utilizing the already present silicon substrate to form silicon-based devices some fabrication steps may be removed from the production process, making it overall less complex.

A further scope of applicability of the present invention will become apparent from the detailed description given below. However, it should be understood that the detailed description and specific examples, while indicating preferred embodiments of the invention, are given by way of illustration only, since various changes and modifications within the scope of the invention will become apparent to those skilled in the art from this detailed description.

Hence, it is to be understood that this invention is not limited to the particular component parts of the device described or acts of the methods described as such device and method may vary. It is also to be understood that the terminology used herein is for purpose of describing particular embodiments only, and is not intended to be limiting.

It must be noted that, as used in the specification and the appended claims, the articles "a," "an," "the," and "said" are intended to mean that there are one or more of the elements unless the context clearly dictates otherwise. Thus, for example, reference to "a unit" or "the unit" may include several devices, and the like. Furthermore, the words "comprising", "including", "containing" and similar wordings does not exclude other elements or steps.

BRIEF DESCRIPTION OF THE DRAWINGS

The above and other aspects of the present invention will, in the following, be described in more detail with reference to appended figures. The figures should not be considered limiting; instead they should be considered for explaining and understanding purposes.

As illustrated in the figures, the sizes of layers and regions may be exaggerated for illustrative purposes and, thus, are provided to illustrate the general structures. Like reference numerals refer to like elements throughout.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and to fully convey the scope of the invention to the skilled person.

Figure 1:
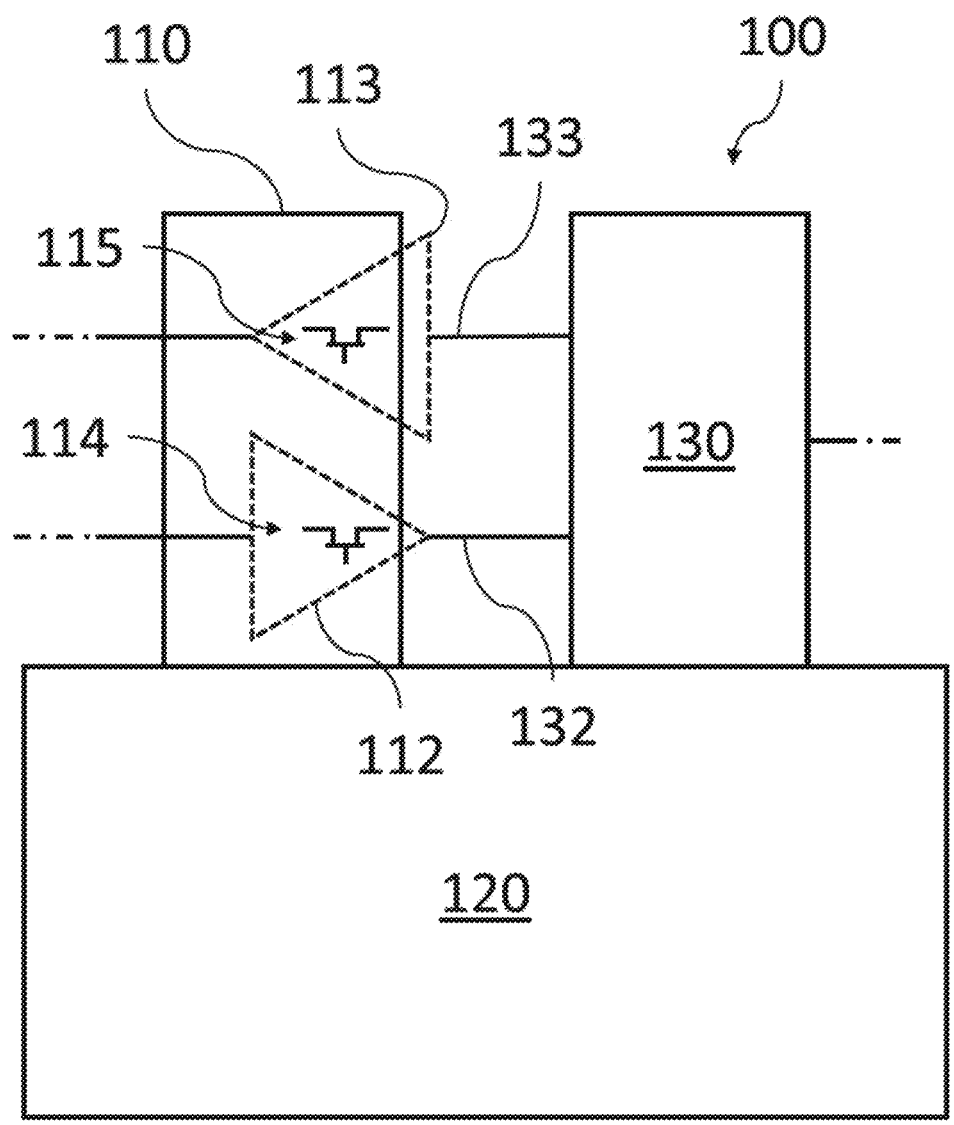
FIG. 1 shows a schematic of a MMIC front-end module.

FIG. 1 shows a monolithic microwave integrated circuit, MMIC, front-end module 100.

The MMIC front-end module 100 comprises a gallium nitride structure 110. The gallium nitride structure 110 is supported by a silicon substrate 120.

The MMIC front-end module 100 further comprises a silicon-based transmit/receive switch 130. The transmit/receive switch 130 has a transmit mode and a receive mode.

The gallium nitride structure 110 may have a lateral dimension in the range from 0.1 μm to 10 μm. The gallium nitride structure 110 may have a circle shape or a polygon shape as seen from a top view. The gallium nitride structure 110 may have a hexagon shape.

The silicon-based transmit/receive switch 130 may be integrally formed into the silicon substrate 120. The silicon-based transmit/receive switch 130 may be supported by the silicon substrate 120. The silicon-based transmit/receive switch 130 may be formed in an added silicon structure, not initially part of the silicon substrate 120. Such an added silicon structure may e.g. be deposited through chemical vapor deposition (CVD) or similar deposition techniques.

The silicon substrate 120 may have a planar top surface with a Miller index of <111>. The silicon substrate 120 may be a substantially monocrystalline silicon substrate. The silicon substrate 120 may be a silicon wafer.

The MMIC front-end module 100 further comprises a transmit amplifier 112 electrically connected 132 to the transmit/receive switch 130. The transmit amplifier 112 may be configured to amplify an outgoing signal to be transmitted by the MMIC front-end module 100. The transmit amplifier 112 comprises a gallium nitride high-electron-mobility transistor, HEMT, 114 formed in the gallium nitride structure 110. The HEMT 114 may comprise a source node, a drain node, and a gate node wherein a voltage applied to the gate node may affect the current between the source node and the drain node.

Figure 6:
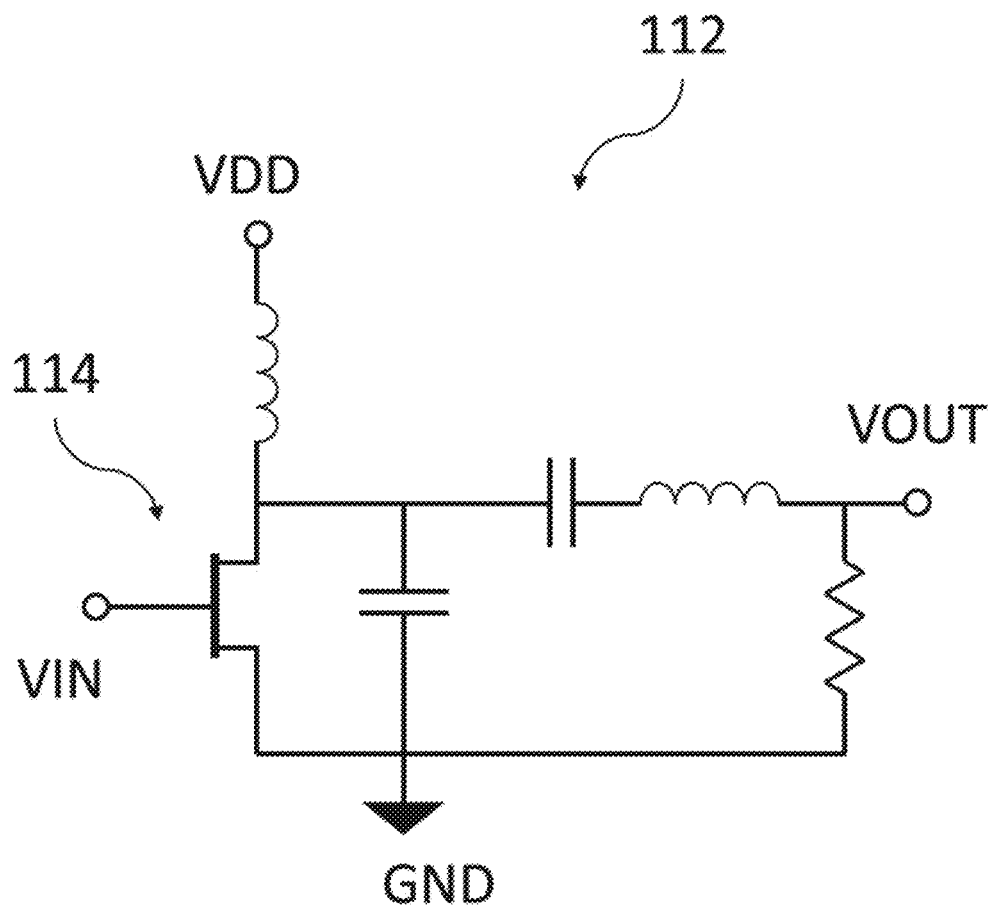
FIG. 6 shows a circuit of an exemplary transmit amplifier.

The transmit amplifier 112 may be a PA. The transmit amplifier 112 may be a class A, B, AB, C, D, E, F, G, or H type PA. The transmit amplifier 112 may be a differential type amplifier. FIG. 6 shows a circuit of an exemplary transmit amplifier 112 being a class E amplifier. The transmit amplifier 112 may be configured to amplify the outgoing signal, e.g. by increasing its voltage or current. The transmit amplifier 112 may comprise a plurality of HEMTs formed in the gallium nitride structure 110.

The MMIC front-end module 100 further comprises a receive amplifier 113 electrically connected 133 to the transmit/receive switch 130. The receive amplifier 113 may be configured to amplify an incoming signal received by the MMIC front-end module 100. The receive amplifier 113 comprises a gallium nitride HEMT 115 formed in the gallium nitride structure 110. The HEMT 115 may also comprise a source node, a drain node, and a gate node wherein a voltage applied to the gate node may affect the current between the source node and the drain node.

Figure 7:
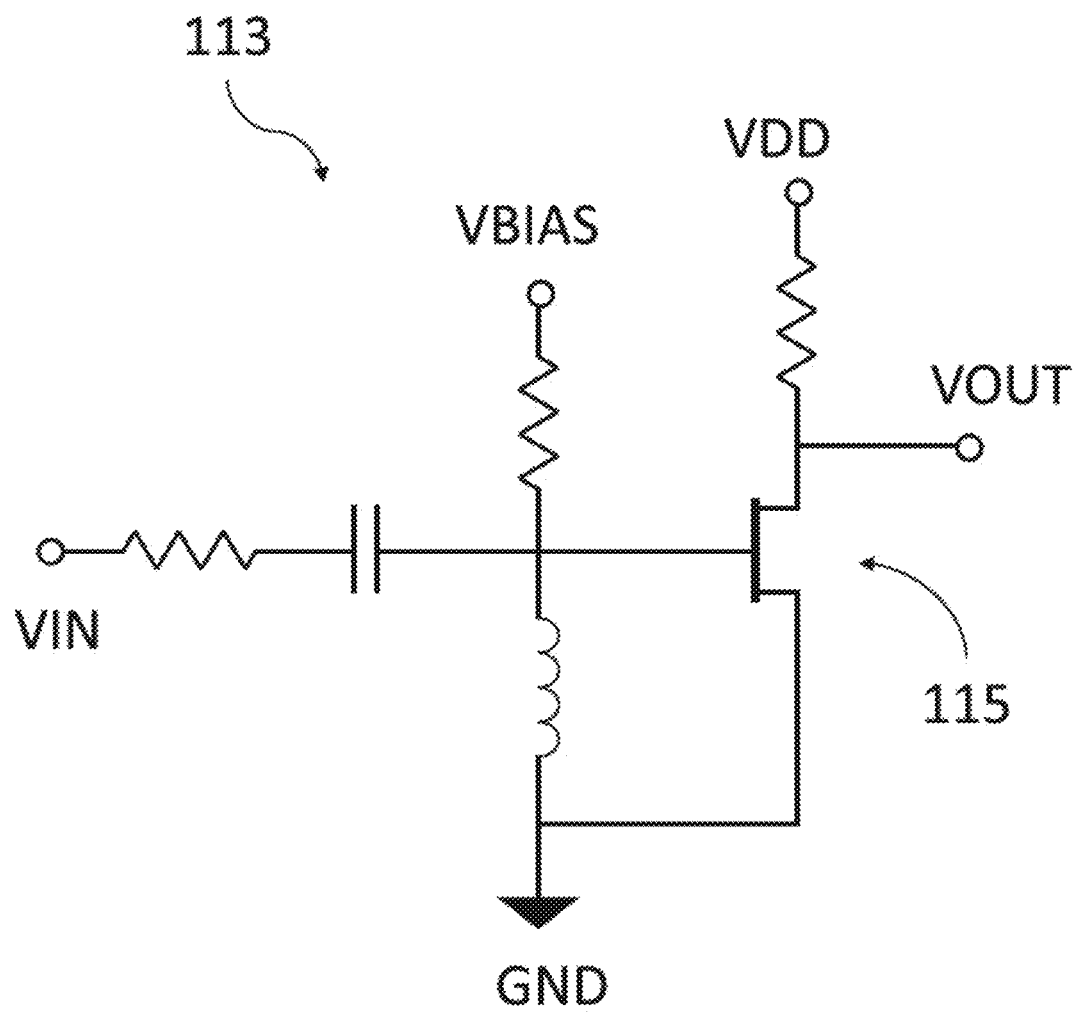
FIG. 7 shows a circuit of an exemplary receive amplifier.

The receive amplifier 113 may be an LNA. The receive amplifier 113 may be a differential type amplifier. FIG. 7 shows a circuit of an exemplary receive amplifier 113. The receive amplifier 113 may be configured to amplify the incoming signal, e.g. by increasing its voltage or current. The receive amplifier 113 may comprise a plurality of HEMTs formed in the gallium nitride structure 110.

In FIGS. 1-4 the amplifiers 112, 113 are illustrated as dashed triangles. These should be seen as schematic block representations of amplifiers while FIGS. 6-7 illustrate exemplary circuits of the amplifiers 112, 113.

In FIG. 6, the output node (VOUT) corresponds to the electrical connection 132. In FIG. 7, the input node (VIN) corresponds to the electrical connection 133.

Note that VIN and VOUT are referred to on an individual amplifier level. Hence, the VIN node in FIG. 6 does not correspond to the VIN node in FIG. 7. For the same reasons, the VOUT node in FIG. 6 does not correspond to the VOUT node in FIG. 7. The drive node (VDD) may be shared or separate for both amplifiers 112, 113. The VDD node may, or be adapted to, have a substantially fixed voltage level. The ground node (GND) may be shared or separate for both amplifiers 112, 113. The GND node may refer be understood as a relative ground node having a substantially fixed voltage level. The GND node may have a voltage level lower than the VDD node voltage level. The bias node (VBIAS) of the exemplary LNA in FIG. 7 may, or be adapted to, have a bias voltage level configured to affect a voltage level at the gate node of the HEMT 115. The exemplary circuits are also shown to comprise resistances, inductors, and capacitors which may be formed as discrete components or as inherent parts based on the characteristics of the electrical conductors in the amplifier circuits.

Setting the transmit/receive switch 130 in the transmit mode may comprise forming an electrical path from the transmit amplifier 112, via the electrical connection 132, through the transmit/receive switch 130 to e.g. an antenna. Setting the transmit/receive switch 130 in the receive mode may comprise forming an electrical path from the receive amplifier 113, vi the electrical connection 133, through the transmit/receive switch 130 to e.g. an antenna.

Figure 2:
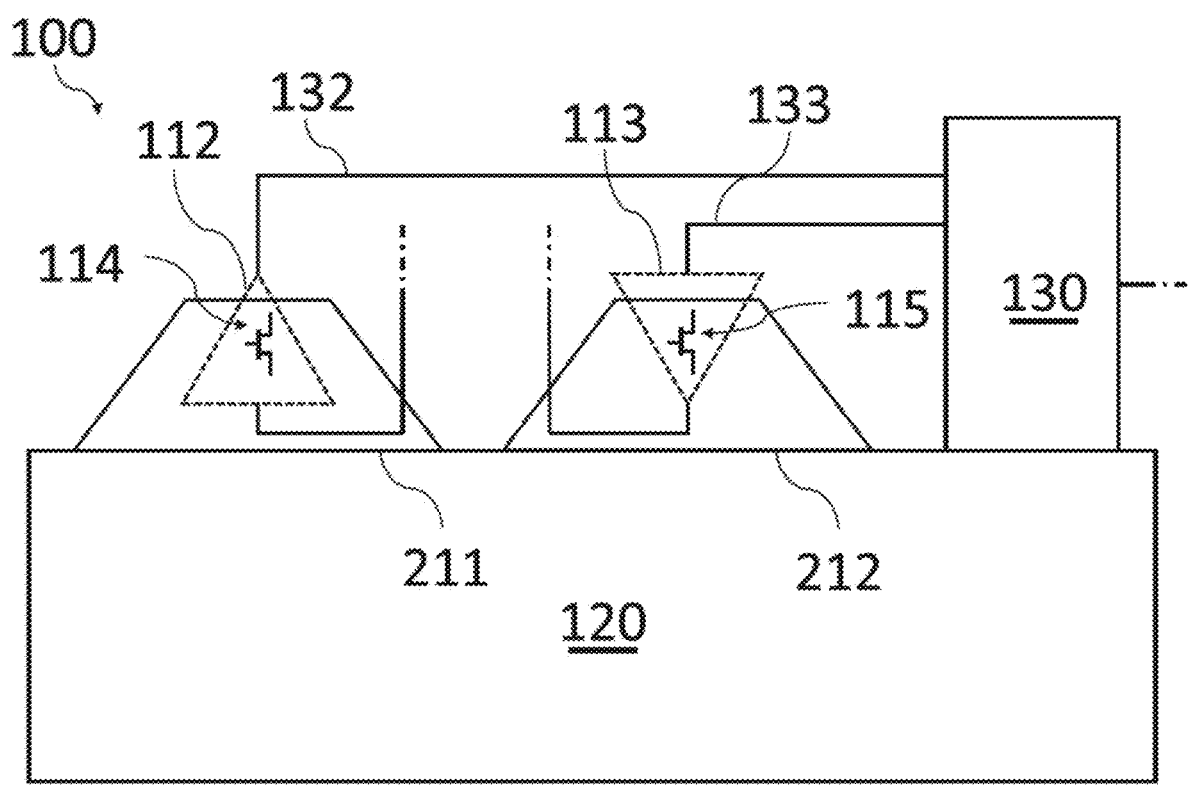
FIG. 2 shows a schematic of a MMIC front-end module comprising two gallium nitride islands.

FIG. 2 shows a MMIC front-end module 100 wherein the gallium nitride structure 110 supported by the silicon substrate 120 comprises a first gallium nitride island 211 and a second gallium nitride island 212. The first gallium nitride island 211 and the second gallium nitride island 212 are physically separated and laterally co-arranged on the silicon substrate 120.

The gallium nitride HEMT 114 of the transmit amplifier 112 may be formed in the first gallium nitride island 211. The gallium nitride HEMT 115 of the receive amplifier 113 may be formed in the second gallium nitride island 212.

The first gallium nitride island 211 may have a lateral dimension in the range from 0.1 μm to 10 μm. The second gallium nitride island 212 may have a lateral dimension in the range from 0.1 μm to 10 μm. The gallium nitride islands 211, 212 may have a circle shape or a polygon shape as seen from a top view. The gallium nitride islands 211, 212 may have a hexagon shape.

Figure 3:
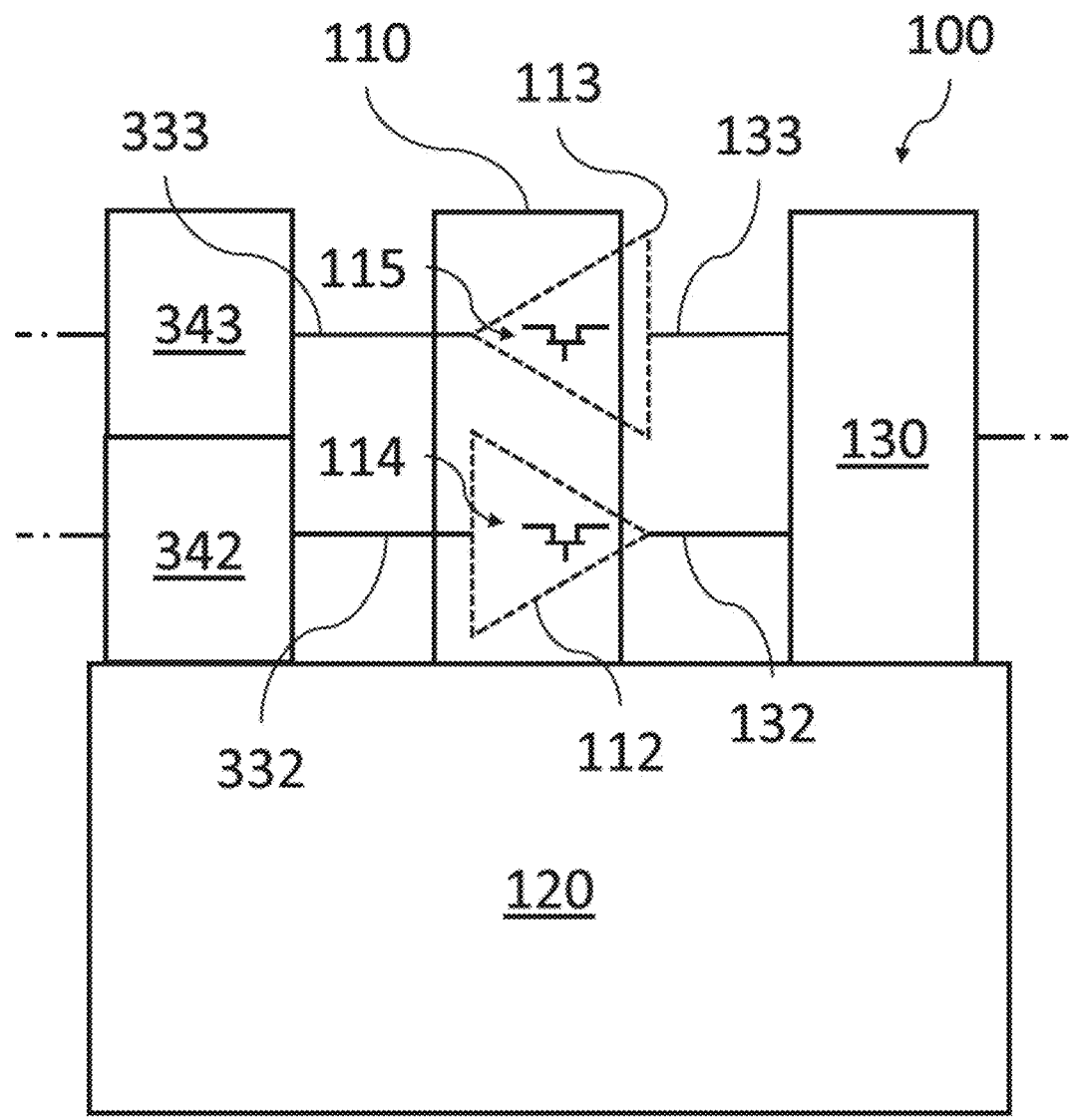
FIG. 3 shows a schematic of a MMIC front-end module comprising a frequency up-converter and a frequency down-converter.

FIG. 3 shows a MMIC front-end module 100 further comprising a silicon-based frequency up-converter 342, electrically connected 332 to the transmit amplifier 112. The frequency up-converter 342 may be configured to up-convert a frequency of an outgoing signal to be transmitted by the MMIC front-end module 100.

The MMIC front-end module 100 may further comprise a silicon-based frequency down-converter 343, electrically connected 333 to the receive amplifier 113. The frequency down-converter 343 may be configured to down-convert a frequency of an incoming signal received by the MMIC front-end module 100.

The frequency up- and down converters 342, 343 may be mixers. The frequency up- and downconverters 342, 343 may be connected to a local oscillator that outputs a predictable oscillating signal. The frequency up-converter 342 may convert an outgoing signal being an IF signal to a corresponding RF signal. The frequency down-converter 343 may convert an incoming signal being a RF signal to a corresponding IF signal. Wherein the IF<<RF.

The silicon-based frequency up- and down-converters 342, 343 may be integrally formed into the silicon substrate 120. The silicon-based frequency up- and down-converters 342, 343 may be formed in an added silicon structure, not initially part of the silicon substrate 120. Such an added silicon structure may e.g. be deposited through CVD or similar deposition techniques.

Figure 4:
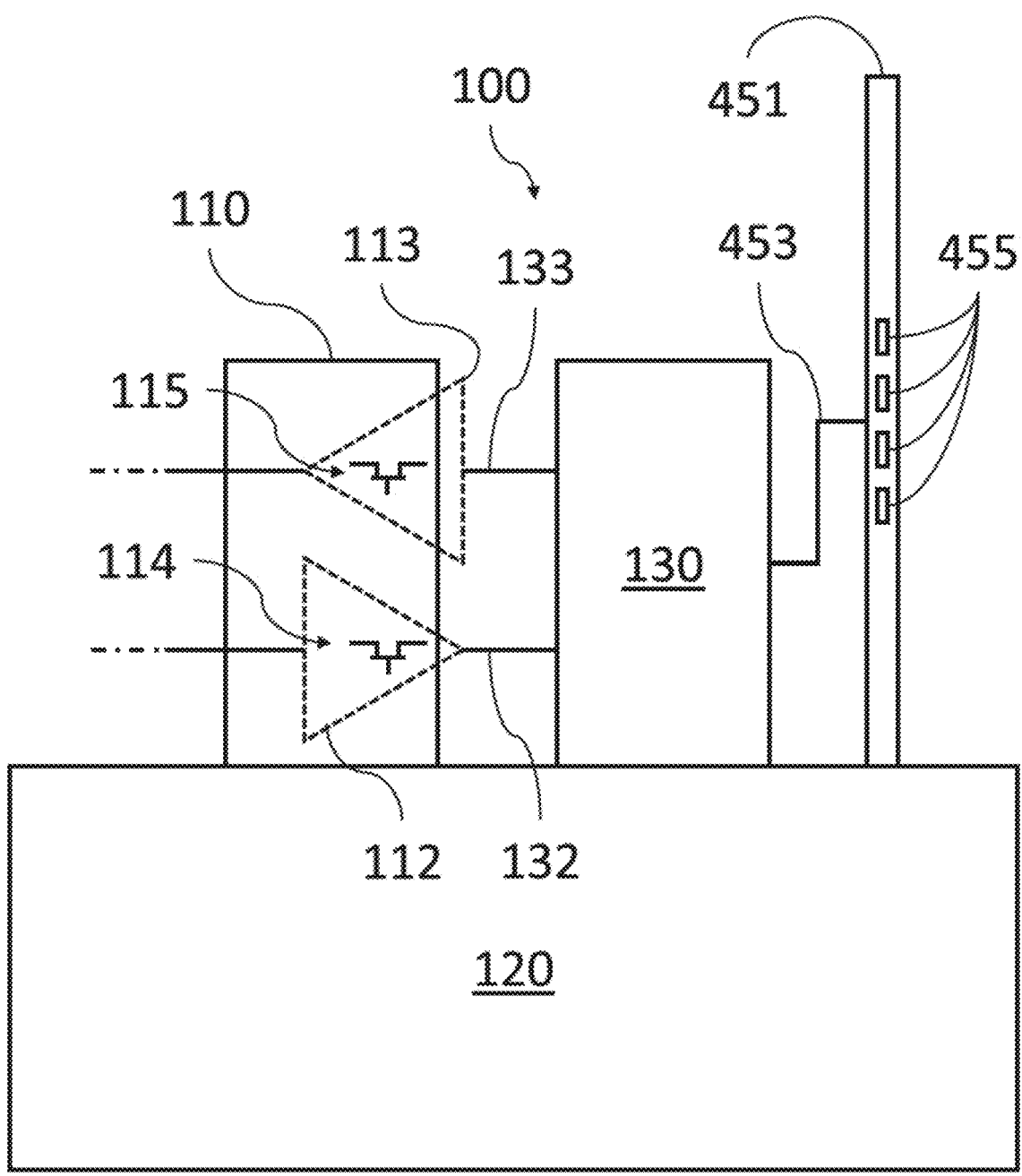
FIG. 4 shows a schematic of a MMIC front-end module comprising an antenna.

FIG. 4 shows a MMIC front-end module 100 further comprising an antenna 451. The antenna 451 may be configured to transmit and receive wireless signals. The transmit/receive switch 130 may be electrically connected 453 to the antenna 451.

The antenna 451 may be configured to transmit and receive electromagnetic wireless signals. The antenna 451 may be configured and/or optimized to transmit and receive wireless signals with a frequency in the range from 10 MHz to 100 GHz, preferably in the range from 24 GHz to 72 GHz.

The antenna 451 may be e.g. a dipole antenna, a monopole antenna, a patch antenna, etc. The antenna 451 may be a multiple input multiple output (MIMO) antenna. The antenna 451 may comprise a perfect electrical conductor (PEC). The antenna 451 may comprise a metal. The antenna 451 may comprise a degenerately doped semiconductor, e.g. silicon. The antenna 451 may comprise dielectric material.

The antenna 451 may be supported by the silicon substrate 120. The antenna 451 may be integrally formed into the silicon substrate 120

The antenna 451 may be an array antenna. The array antenna comprising a plurality of antenna array elements 455.

Figure 5:
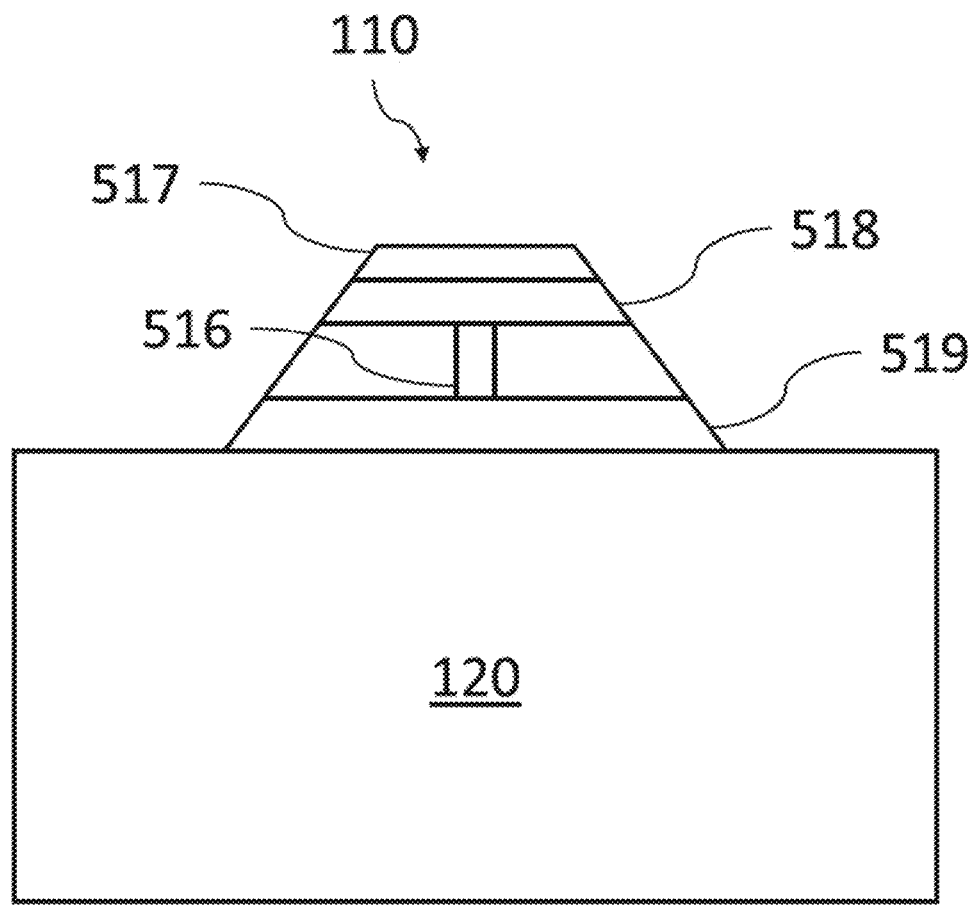
FIG. 5 shows a cross-sectional schematic of a gallium nitride structure.

FIG. 5 shows the gallium nitride structure 110 comprising a vertical nanowire structure 516 arranged perpendicularly to the silicon substrate 120.

The vertical nanowire structure 516 may comprise or substantially consist of gallium nitride. The vertical nanowire structure 516 may comprise or substantially consist of aluminium nitride. The gallium nitride structure 110 may comprise a plurality of vertical nanowire structures 516. The vertical nanowire structure 516 may be formed onto the silicon substrate 120.

The gallium nitride structure 110 may comprise a gallium nitride layer 517 and an $Al_xGa_{1-x}N$ layer 518, wherein $0 \leq x \leq 0.95$. The gallium nitride layer 517 may be situated onto the $Al_xGa_{1-x}N$ layer 518 in vertical direction from the substrate 120. The $Al_xGa_{1-x}N$ layer 518 may laterally and vertically enclose the vertical nanowire structure 516.

The $Al_xGa_{1-x}N$ layer 518 may comprise a continuous or discrete grading. Continuous grading may be understood as the value x changes substantially continuously for different positions in the $Al_xGa_{1-x}N$ layer 518 along the vertical direction. Similarly, discrete grading may be understood as the value x changing by larger discrete steps, e.g. −0.2 per step, for different positions in the $Al_xGa_{1-x}N$ layer 518 along the vertical direction.

The gallium nitride structure 110 may comprise an aluminium nitride layer 519. The aluminium nitride layer 519 may be situated below the $Al_xGa_{1-x}N$ layer 518 in vertical direction from the substrate 120.

The gallium nitride structure 110 may be further understood as a "semiconductor layer structure" within the context of European patent application number 19215267.6 as-filed. See the text in the summary relating to "the first aspect". See also FIGS. 1-4 and the corresponding portions of the description. The identified subject matter is hereby incorporated by reference.

The HEMTs 114, 115 may be further understood as a HEMTs according to the same European patent application number 19215267.6 as-filed. See the text in the summary relating to "the second aspect". See also FIGS. 5-6 and the corresponding portions of the description. The identified subject matter is hereby incorporated by reference.

In general, the electrical connections 132, 133, 333, 332, 453, as well as other connections not numerically referenced e.g. connections internal to the amplifiers 112, 113, may be understood as any physical connections suitable for transmission of electrical currents. The connections may be formed as part of conventional back end of line (BEOL) processing for silicon integrated circuits.

The electrical connections 132, 133, 333, 332, 453 may comprise metal material such as aluminium, copper, palladium, silver, and/or gold, as well as alloys of the aforementioned materials. For example, an alloy used for the electrical connections 132, 133, 333, 332, 453 may comprise aluminium and copper or alternatively palladium and gold. The electrical connections 132, 133, 333, 332, 453 may be realized as degenerately doped semiconductor, e.g. silicon.

A method for forming the MMIC front-end module 100 may comprise:

providing a silicon substrate 120 covered with a gallium nitride layer structure;

etching a gallium nitride structure 110 or a plurality of gallium nitride islands 211, 212 out of the gallium nitride layer structure;

optionally depositing, by CVD, polycrystalline silicon structures onto the silicon substrate 120;

forming silicon-based devices 130, 342, 343 in the silicon substrate 120 or in the deposited polycrystalline silicon structures;

forming gallium nitride HEMT devices 114, 115 in the gallium nitride structure 110 or the plurality of gallium nitride islands 211, 212.

forming metal layers, vias, and interconnects to connect the silicon-based devices 130, 342, 343 with the gallium nitride HEMT devices; and passivating, by e.g. deposition, the above MMIC front-end module 100.

The MMIC front-end module 100 may be configured for $5^{th}$ Generation New Radio (5G NR) communication. The MMIC front-end module 100 may be configured for Bluetooth communication. The MMIC front-end module 100 may be part of a network interconnect point, e.g. a wireless base station. The MMIC front-end module 100 may be a part of a network device, e.g. a mobile device, a computer, an internet-of-things (IoT) device, etc. The skilled person understands that the present invention is not limited in any way to just the above examples. The MMIC front-end module 100 may be configured for a frequency in the range from 10 MHz to 100 GHz, preferably in the range from 24 GHz to 72 GHz. The MMIC front-end module 100 may alternatively be configured for a frequency in the range from 1 GHz to 3 GHz, preferably in the range from 2.4 GHz to 2.5 GHz when the MMIC front-end module 100 configured for Bluetooth communication.

Additionally, variations to the disclosed embodiments can be understood and effected by the skilled person in practicing the claimed invention, from a study of the drawings, the disclosure, and the appended claims.

The invention claimed is:

1. A monolithic microwave integrated circuit, MMIC, front-end module comprising:
    a gallium nitride structure supported by a silicon substrate;
    a silicon-based transmit/receive switch having a transmit mode and a receive mode;
    a transmit amplifier configured to amplify an outgoing signal to be transmitted by the MMIC front-end module, wherein the transmit amplifier is electrically connected to the transmit/receive switch, wherein the transmit amplifier comprises a gallium nitride high-electron-mobility transistor, HEMT, formed in the gallium nitride structure; and
    a receive amplifier configured to amplify an incoming signal received by the MMIC front-end module, wherein the receive amplifier is electrically connected to the transmit/receive switch, wherein the receive amplifier comprises a gallium nitride HEMT formed in the gallium nitride structure.

2. The MMIC front-end module according to claim 1, wherein the transmit amplifier comprises a plurality of HEMTs formed in the gallium nitride structure.

3. The MMIC front-end module according to claim 1, wherein the receive amplifier comprises a plurality of HEMTs formed in the gallium nitride structure.

4. The MMIC front-end module according to claim 1, wherein the gallium nitride structure supported by the silicon substrate comprises a first gallium nitride island and a second gallium nitride island, wherein the first gallium nitride island and the second gallium nitride island are physically separated and laterally co-arranged on the silicon substrate.

5. The MMIC front-end module according to claim 4, wherein the gallium nitride HEMT of the transmit amplifier is formed in the first gallium nitride island, and wherein the gallium nitride HEMT of the receive amplifier is formed in the second gallium nitride island.

6. The MMIC front-end module according to claim 4, wherein the first gallium nitride island and the second gallium nitride island has a lateral dimension in the range from 0.1 µm to 10 µm.

7. The MMIC front-end module according to claim 1, wherein the gallium nitride structure has a lateral dimension in the range from 0.1 µm to 10 µm.

8. The MMIC front-end module according to claim 1, further comprising a silicon-based frequency up-converter, electrically connected to the transmit amplifier, wherein the frequency up-converter is configured to up-convert a frequency of the outgoing signal to be transmitted by the MMIC front-end module.

9. The MMIC front-end module according to claim 1, further comprising a silicon-based frequency down-converter, electrically connected to the receive amplifier, wherein the frequency down-converter is configured to down-convert a frequency of the incoming signal received by the MMIC front-end module.

10. The MMIC front-end module according to claim 1 further comprising an antenna configured to transmit and receive wireless signals wherein the transmit/receive switch is electrically connected to the antenna.

11. The MMIC front-end module according to claim 10, wherein the antenna is supported by the silicon substrate.

12. The MMIC front-end module according to claim 10, wherein the antenna is an array antenna, the array antenna comprising a plurality of antenna array elements.

13. The MMIC front-end module according to claim 1, wherein the gallium nitride structure comprises a vertical nanowire structure arranged perpendicularly to the silicon substrate.

14. The MMIC front-end module according to claim 1, wherein the gallium nitride structure comprises a gallium nitride layer and an $Al_xGa_{1-x}N$ layer, wherein $0 \leq x \leq 0.95$.

15. The MMIC front-end module according to claim 1, wherein the gallium nitride structure comprises an aluminum nitride layer.

16. The MMIC front-end module according to claim 1, wherein the silicon-based transmit/receive switch is integrally formed into the silicon substrate.

17. The MMIC front-end module according to claim 1, wherein the silicon-based transmit/receive switch is supported by the silicon substrate.

* * * * *